(12) United States Patent
Maruyama

(10) Patent No.: US 6,671,199 B2
(45) Date of Patent: Dec. 30, 2003

(54) DATA STORAGE METHOD FOR SEMICONDUCTOR INTEGRATED CIRCUIT, SEMICONDUCTOR INTEGRATED CIRCUIT, SEMICONDUCTOR DEVICE EQUIPPED WITH MANY OF THE SEMICONDUCTOR INTEGRATED CIRCUITS, AND ELECTRONIC APPARATUS USING THE SEMICONDUCTOR DEVICE

(75) Inventor: Akira Maruyama, Fujimi-machi (JP)

(73) Assignee: Seiko Epson Corporation (JP)

( * ) Notice: Subject to any disclaimer, the term of this patent is extended or adjusted under 35 U.S.C. 154(b) by 81 days.

(21) Appl. No.: 09/894,970

(22) Filed: Jun. 28, 2001

(65) Prior Publication Data

US 2002/0015323 A1 Feb. 7, 2002

(30) Foreign Application Priority Data

Jun. 30, 2000 (JP) .......................... 2000-198620
Jun. 20, 2001 (JP) .......................... 2001-186696

(51) Int. Cl.⁷ .............................................. G11C 11/22
(52) U.S. Cl. ........................ 365/145; 365/149; 365/117
(58) Field of Search .............................. 365/145, 149, 365/117

(56) References Cited

U.S. PATENT DOCUMENTS

| 5,038,323 | A | * | 8/1991 | Schwee ...................... 365/145 |
| 5,668,753 | A | * | 9/1997 | Koike ......................... 365/145 |
| 5,668,754 | A | * | 9/1997 | Yamashita .................. 365/145 |
| 5,991,188 | A | * | 11/1999 | Chung et al. ............... 365/145 |
| 6,449,184 | B2 | * | 9/2002 | Kato et al. .................. 365/145 |
| 2001/0053087 | A1 | * | 12/2001 | Kato et al. .................. 365/149 |
| 2002/0006052 | A1 | * | 1/2002 | Kato et al. .................. 365/145 |
| 2002/0145903 | A1 | * | 10/2002 | Hasegawa ................... 365/145 |

* cited by examiner

*Primary Examiner*—Viet Q. Nguyen
(74) *Attorney, Agent, or Firm*—Harness, Dickey & Pierce, P.L.C.

(57) ABSTRACT

In a data storage method for memory cells 1, 2 that compose a semiconductor integrated circuit, a power supply potential VDD or a potential VL that is lowered from the power supply potential VDD by a threshold potential of Nch transistors 9, 10 and 11 is applied for each of the directions of the voltages that are applied to a ferroelectric capacitor 6 in response to data to thereby perform writing. In the present invention, a semiconductor device equipped with a plurality of semiconductor integrated circuits described above is applied to FeRAMs or DRAMs, and the semiconductor device is used in a hand-carry type data terminal, a telephone and the like.

7 Claims, 6 Drawing Sheets

| Data | Data 1 | Data 2 | VBL | VPL | VSAA | VSAB | VSAC |
|---|---|---|---|---|---|---|---|
| A | H | H | VDD | GND | H | H | H |
| B | L | H | VL | GND | L | H | H |
| C | L | L | GND | VL | L | L | H |
| D | H | L | GND | VDD | L | L | L |

DATA STORAGE METHOD FOR SEMICONDUCTOR INTEGRATED CIRCUIT, SEMICONDUCTOR INTEGRATED CIRCUIT, SEMICONDUCTOR DEVICE EQUIPPED WITH MANY OF THE SEMICONDUCTOR INTEGRATED CIRCUITS, AND ELECTRONIC APPARATUS USING THE SEMICONDUCTOR DEVICE

BACKGROUND OF THE INVENTION

1. Technical Field

The present invention relates to a capacitor as a charge storage capacitor, a data storage method for a semiconductor integrated circuit equipped with switching elements as transfer gates, a semiconductor integrated circuit, a semiconductor device equipped with many of the semiconductor integrated circuits, and an electronic apparatus using the semiconductor device.

2. Conventional Technology

FIG. 12 shows a block diagram of a conventional structure of a semiconductor integrated circuit including a charge storing ferroelectric capacitor. To simplify the description, only two memory cells 1, 2 are shown in the circuit diagram in FIG. 12.

First, the circuit structure is described. The memory cells 1 and 2 include capacitors 6 and 8 as charge storing capacitors formed from ferroelectric material, and Nch transistors 5 and 7 as switching transfer gates, respectively. A bit line BL and a plate line PL are commonly connected to the respective memory cells 1 and 2, and independent word lines WL1 and WL2 are connected to gates of the Nch transistors 5 and 7, respectively. The bit line BL is connected to a sense amplifier 3 for data reading and to a restore/write circuit 4.

Next, a writing operation of the semiconductor integrated circuit is described.

In order to write in the memory cell 1, a bit line potential VBL and a plate line potential VPL are set at a grounding potential (hereinafter, GND potential), then the GND potential on the word line WL1 is shifted to a power supply potential VDD to thereby put the transistor 5 in an ON state.

When data is H data, the restore/write circuit 4 sets the bit line potential VBL to the power supply potential VDD, and the plate line potential VPL to the GND potential, whereby an electric field directing from the bit line toward the plate line is applied to the capacitor 6, and a charge (data) associated with a polarization corresponding to the strength and the direction of the electric field is written in the ferroelectric capacitor 6.

When data is L data, the bit line potential VBL is shifted to the GND potential, and the plate line potential VPL to the power supply potential VDD, whereby an electric field directing from the plate line toward the bit line is applied to the capacitor 6, and a charge (data) associated with a polarization corresponding to the strength and the direction of the electric field is written in the ferroelectric capacitor 6.

Then, the power supply potential VDD on the word line WL 1 is shifted to the GND potential to thereby place the transistor 5 in an OFF state to retain the written data and complete the writing operation.

On the other hand, for the memory transistor 2, the word line WL 2 is retained at the GNP potential to put the transistor 7 in an OFF state and a writing operation is not conducted.

Next, a reading operation of the semiconductor integrated circuit is described.

In order to read the memory cell 1, the bit line potential VBL and the plate line potential VPL are set at the GND potential, and then the GND potential on the word line WL 1 is shifted to the power supply potential VDD to thereby put the transistor 5 in an ON state. Then, when the plate line potential VPL is shifted to the power supply potential VDD, a potential corresponding to a charge (data) associated with the polarization retained in the ferroelectric capacitor 5 is generated on the bit line BL. When a reference level VREF of the sense amplifier 3 is set at an intermediate value between bit line potentials to be generated corresponding to H level and L level of data, data corresponding to H level or L level is amplified and outputted by the sense amplifier 3.

Then, when data is H data, the restore/write circuit 4 shifts the bit line potential VBL to the power supply potential VDD, and the plate line potential VPL to the GND potential to thereby conduct a restore operation.

When data is L data, the bit line potential VBL is shifted to the GND potential, and the plate line potential VPL to the power supply potential VDD to thereby conduct a restore operation.

In the conventional semiconductor integrated circuit described above, its memory cell is formed from two elements that are one transistor and one capacitor, and therefore its memory cell area becomes large compared to, for example, a flash memory in which its memory cell is formed from one transistor. Therefore, a ferroelectric memory (FeRAM: Ferroelectric Random-access Memory) has a substantially small capacity compared to a flash memory and is difficult to provide a larger capacity.

One of the sources of the problem is that, for storing data, one memory cell can store only one bit data.

The present invention has been made to solve this problem, and its object is to retain data of two bits or greater (multiple values) in one memory cell to thereby increase the degree of effective integration and to facilitate obtaining a larger capacity.

SUMMARY OF THE INVENTION

In a data storage method for a semiconductor integrated circuit in accordance with an embodiment of the present invention, in a memory cell equipped with a ferroelectric material that stores data depending on a polarization state determined by an applied voltage and a direction of the voltage, different voltages in the number of at least two values or greater are applied for each of the directions of the applied voltages to store data Also, a semiconductor integrated circuit in accordance with an embodiment of the present invention is equipped with a memory cell including a ferroelectric capacitor for storing a charge, and an n-type switching transistor for storing or discharging the charge. One of the electrodes of the capacitor connects to a plate line, and the other of the electrodes connects to one of source/drain of the n-type transistor. A bit line is connected to the other of source/drain of the n-type transistor. The bit line is connected to a sense amplifier circuit for reading data and the data writing circuit and the plate line is connected to the data writing circuit. The n-type transistor has a gate that is connected to a word line for selecting a memory cell, through which voltage is applied to drive the transistor on and off. In the semiconductor integrated circuit described above, a plurality of voltage values are applied by the data writing circuit between the bit line and the plate line, to thereby store charges in the capacitor according to the voltage values to thereby store a plurality of data.

Furthermore, an electronic apparatus in accordance with one embodiment of the present invention is equipped with the above-described semiconductor device.

DETAILED DESCRIPTION OF THE PREFERRED EMBODIMENTS

In a semiconductor integrated circuit in accordance with one embodiment of the present invention, in contrast to the conventional example described above, the potential to be applied to one memory cell including a charge storing ferroelectric capacitor includes potentials set at a first potential, a second potential higher than the first potential and a third potential having an intermediate value between the first potential and the second potential. For example, when the first potential is set to a GND potential and the second potential is set to a power supply potential VDD, the third potential has a value between the GND potential and power supply potential VDD. In setting potentials having values between the first potential and the second potential, the potential to be added and set is not limited to one potential, but a plurality of potentials may be set. As a result, data in plural bits can be stored. The number of bits to be stored can be increased according to the number of potentials that are added.

Also, a semiconductor device in accordance with one embodiment of the present invention is provided with numerous memory cells arranged with one another, each connected to word lines, bit lines and plate lines, to thereby form a memory cell group, and the bit lines and the plate lines are connected to a sense amplifier circuit and a data writing circuit. One example in which the present embodiment is applied to a FeRAM is shown in a partial circuit diagram in FIG. 1. In the embodiment shown in FIG. 1, to describe the subject matter of the embodiment in a manner readily understood, the first potential is set at the GND potential, the second potential is set at the power supply potential VDD, and an additional potential to be applied to one memory cell beside the first and second potentials is set at one potential that is defined by a potential VL. As a result, the number of bits that can be stored in one memory cell is increased from one in the conventional art to two.

Figure 1:
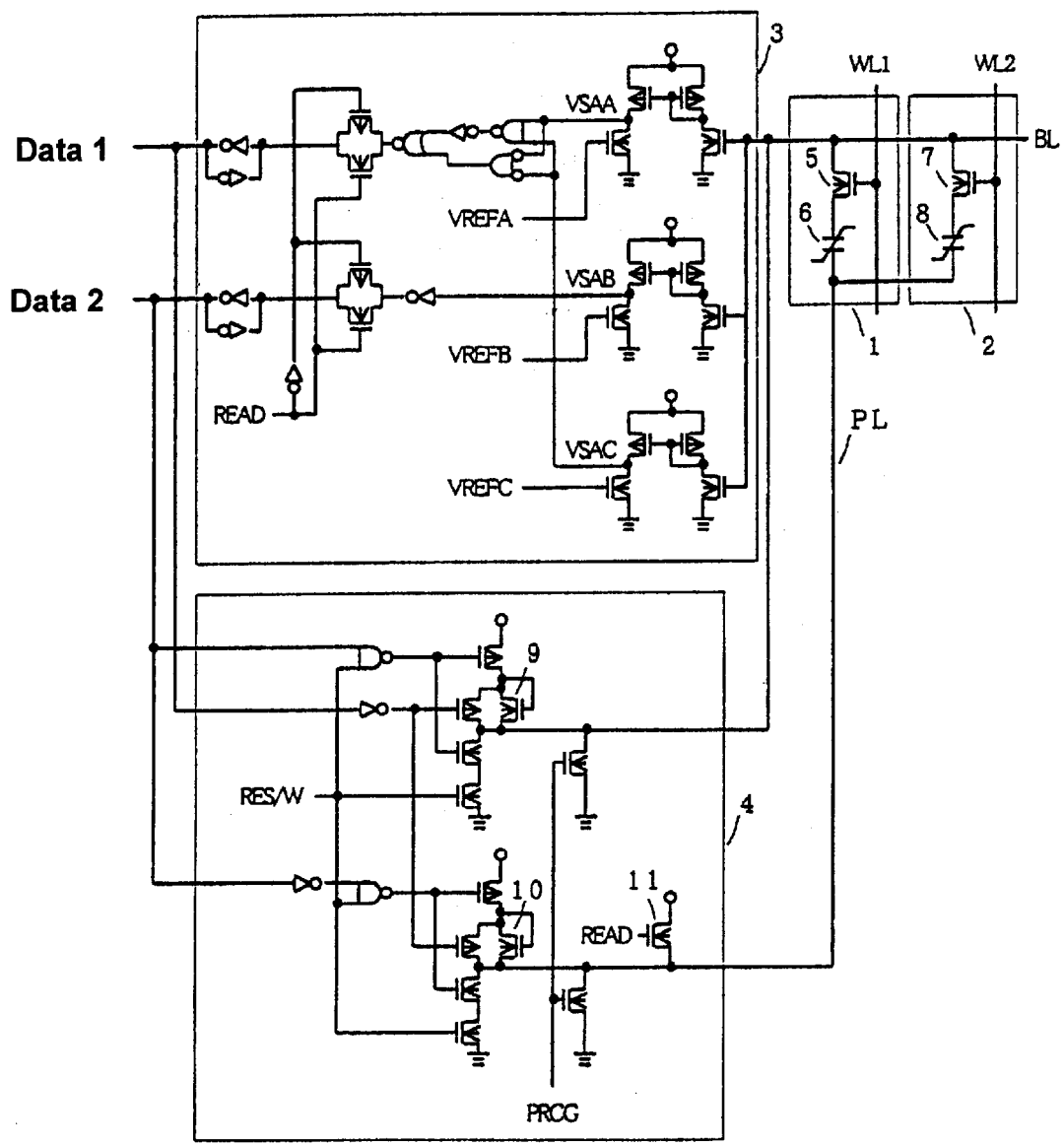
FIG. 1 shows a semiconductor integrated circuit in accordance with one embodiment of the present invention.

For convenience of description, FIG. 1 shows only two memory cells 1 and 2 connected to a common bit line BL with two word lines and one bit line in a semiconductor integrated circuit for storing data that composes a semiconductor device.

First, a circuit structure thereof is described. The memory cells 1 and 2 include, as their components, capacitors 6 and 8 as charge storing capacitor composed of ferroelectric material and Nch transistors 5 and 7 as switching transfer gates, respectively. A plate line PL is commonly connected to one of electrodes of each of the capacitors 6 and 8, and the other of the electrodes is connected to one of source/drain of each of the Nch transistors 5 and 7. The bit line BL is commonly connected to the other of the source/drain of each of the Nch transistors 5 and 7. Independent word lines WL1 and WL2 are connected to gates of the respective Nch transistors 5 and 7, respectively. The bit line BL is connected to a sense amplifier 3 for reading data and a restore/write circuit 4.

In the embodiment shown in FIG. 1, one potential VL is added as an additional potential to be applied to one memory cell. Therefore, three types of reference levels VREFA, VREFB and VREFC (to be described in detail below) that provide determination references for potentials that appear on the bit line BL depending on the storage capacity of the capacitors 5 and 7 are inputted in the sense amplifier circuit 3, and logical values in two types of data 1 and 2 that are read can be outputted externally through the corresponding data lines.

In one structure in accordance with one embodiment of the present invention, in principle, when a power supply potential VDD is added besides a GND potential, and also k types of other potential values are additionally set as potentials to be applied to one memory cell, the reference levels VREF in the number of $\{2^{(k+1)}-1\}$ can be supplied to the bit line BL. More concretely, circuit block stages each being formed from 4 transistors, which are provided between VREFB or VREFC among the three kinds of reference levels and the bit line BL in FIG. 1, are added in parallel with one another in the number of the reference levels VERF. It goes without saying that the structure of the circuit blocks is not limited to the example shown in FIG. 1, and its design can be optionally modified. As a result, this contributes to increasing the number of bits that can be stored in one memory cell from 1 in the conventional art to (k+1). It is noted that, in the example shown in FIG. 1, k=1.

On the other hand, the restore/write circuit 4 is connected to the plate line PL, has a structure that receives two data 1 and 2 provided externally through the corresponding data lines, and supplies potentials corresponding to the data 1 and 2 to the bit line BL and the plate line PL.

In the embodiment shown in FIG. 1, for convenience, one potential VL is applied as an additional potential to one memory cell. In other words, in the restore/write circuit 4, a circuit block existing in a path between the two data lines through which data 1 and 2 are inputted, and the bit line BL and the plate line PL is provided with Nch transistors 9, 10 and 11. Therefore, the potential VL that is lowered from the power supply potential VDD by a threshold potential of the Nch transistors 9, 10 and 11 can be set and added. As a result, one potential, the potential VL, can be added, in addition to the power supply potential VDD besides the GND, as potentials that can be supplied to the bit line BL and the plate line PL. As a consequence, sets of logical values corresponding to the two types of data 1 and 2 can be written in the memory cell.

It is noted that, in one structure in accordance with one embodiment of the present invention, in principle, when a power supply potential VDD is added besides a GND potential, and also k types of other potential values are additionally set as potentials to be applied to one memory cell, the number of data types is (k+1), and the number of input/output data lines corresponding thereto is also (k+1). Further, each of the Nch transistors 9, 10 and 11 is formed from a serial circuit having k number of Nch transistors, instead of being formed from a single transistor. Depending on combinations of threshold values of the k number of Nch transistors that are respectively turned on and off, k types of potential values to be applied to one memory cell can be additionally set. To drive the k number of Nch transistors on and off, respectively, appropriate logical gate circuits may be provided in a path between each of the data lines and the serial circuit of the k-number of Nch transistors, in a similar manner shown in FIG. 1 as an example that contains inverters and NAND gates. It goes without saying that the block structure of the restore/write circuit 4 can be optionally modified without being limited to the example shown in FIG. 1. Therefore, this contributes to increasing the number of bits that can be stored in one memory cell from 1 in the conventional art to (k+1).

Figure 2:
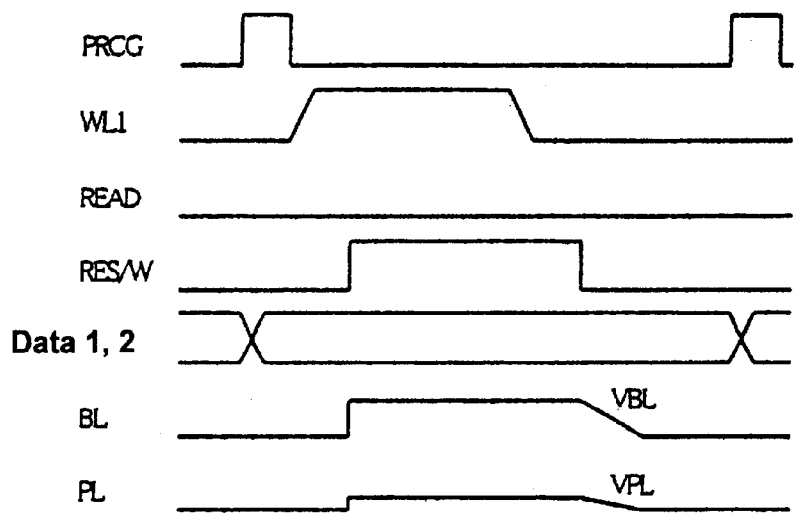
FIG. 2 shows a timing chart in accordance with one embodiment of the present invention.

Next, an operation of the semiconductor integrated circuit in accordance with the embodiment described above with reference to FIG. 1 is described. FIG. 2 shows a timing chart of a writing operation. Based on FIGS. 1 and 2, the writing operation is described. When writing in the memory cell 1, a pre-charge signal PRCG is once set to H level to set the bit line potential VBL and the plate line potential VPL at the GND potential, respectively. Then, the GND potential on the word line WL1 is shifted to the power supply potential VDD to thereby put the transistor 5 in an ON state. Then, a restore/write signal RES/W is set to H level. When data 1 is H data and data 2 is H data, the bit line potential VBL changes to the power supply potential VDD, and the plate line potential VPL changes to the GND potential, such that an electric field directing from the bit line toward the plate line is applied to the capacitor 6, and a charge (data) associated with a polarization depending on the strength and direction of the electric field can be written in the ferroelectric capacitor 6. Then, the power supply potential VDD on the word line WL1 is set to the GND potential, to thereby turn off the transistor 5 to retain the written data, whereby the writing operation is completed. On the other hand, with respect to the memory cell transistor 2, the word line WL2 is retained at the GND potential, to place the transistor 7 in an OFF state and the writing operation is not conducted.

Figures 4, 5:
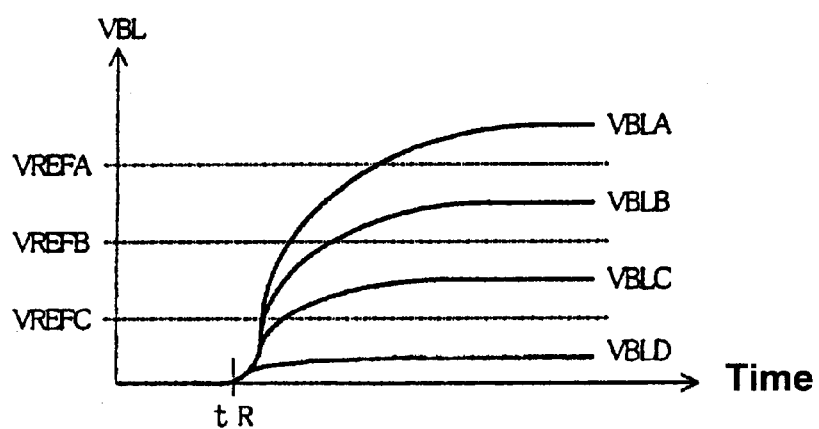
FIG. 4 shows a status in accordance with one embodiment of the present invention.
FIG. 5 shows a graph indicating potential changes in accordance with one embodiment of the present invention.

FIG. 4 is a table showing relations between bit line potentials and plate potentials for conditions of data 1 and 2. In FIG. 4, the potential VL is a potential that is lowered from the power supply potential VDD by a threshold potential of the Nch transistors 9, 10 and 11 shown in FIG. 1. For example, when the data 1 is L data and the data 2 is L data, the bit line potential VBL changes to the GND potential, and the plate line potential VPL changes to the VL potential, such that an electric field directing from the plate line toward the bit line is applied to the capacitor 6, and data depending on the strength and direction of the electric field can be written therein.

Then, the restore/write signal RES/W is set to L level to complete the writing operation.

Figure 6:
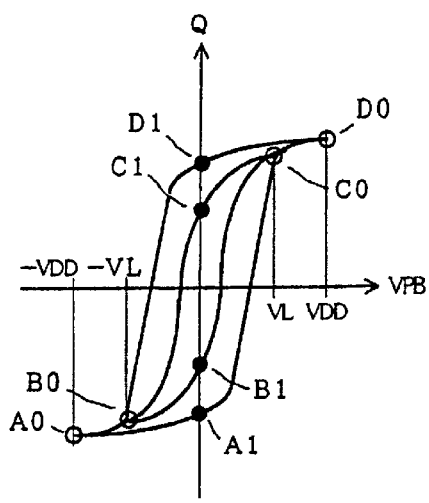
FIG. 6 shows a diagram of hysteresis curves in accordance with one embodiment of the present invention.

FIG. 6 shows hysteresis curves relating to the case when writing in the ferroelectric capacitor, in which potential differences VPB between the bit line and the plate line are indicated along the X-axis and charge amounts associated with polarization are indicated along the Y-axis. When the data 1 is H data and the data 2 is H data (hereafter referred to as data A), the charge is retained at a point A0 during a writing operation and at a point A1 after the writing operation. Similarly, when the data 1 is L data and the data 2 is H data (hereafter referred to as data B), the charge is retained at a point B0 during a writing operation and at a point B1 after the writing operation. Similarly, when the data 1 is L data and the data 2 is L data (hereafter referred to as data C), the charge is retained at a point C0 during a writing operation and at a point C1 after the writing operation. Similarly, when the data 1 is H data and the data 2 is L data (hereafter referred to as data D), the charge is retained at a point D0 during a writing operation and at a point D1 after the writing operation.

Figure 3:
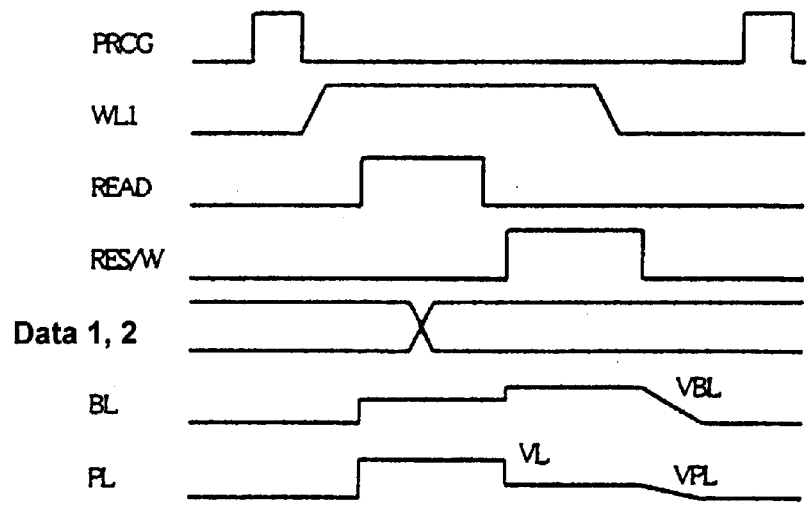
FIG. 3 shows a timing chart in accordance with one embodiment of the present invention.

FIG. 3 shows a timing chart of a reading operation. Based on FIGS. 1 and 3, the reading operation is described. When reading the memory cell 1, a pre-charge signal PRCG is once set to H level to set the bit line potential VBL and the plate line potential VPL at the GND potential, respectively. Then, the GND potential on the word line WL1 is set to the power supply potential VDD to thereby turn on the transistor 5.

Then, a read signal READ is set to H level, the plate potential VPL is set to the potential VL by the Nch transistor 11. As a result, a potential corresponding to the charge (data) associated with the polarization retained at the ferroelectric capacitor 5 is generated on the bit line BL.

Figure 7:
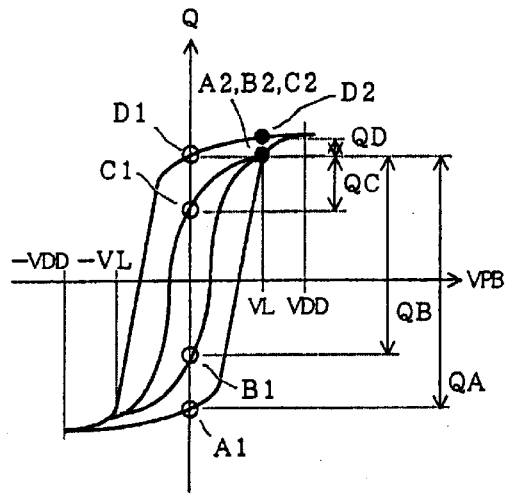
FIG. 7 shows a diagram of hysteresis curves in accordance with one embodiment of the present invention.

FIG. 7 is a graph showing hysteresis curves relating to the case when reading the ferroelectric capacitor. When data that is read is the data A, a charge QA associated with a shift from a point A1 to a point A2 is output to the bit line BL; in the case of the data B, a charge associated with a shift from a point B1 to a point B2 is output to the bit line BL; in the case of the data C, a charge associated with a shift from a point C1 to a point C2 is output to the bit line BL; and in the case of the data D, a charge associated with a shift from a point D1 to a point D2 is output to the bit line BL, and potentials VBLA, VBLB, VBLC and VBLD corresponding thereto are generated, respectively.

It is noted that, in accordance with one embodiment of the present invention, in principle, when a power supply potential VDD is added besides a GND potential, and also k types of other potential values are additionally set as potentials to be applied to one memory cell, the number of data types is (k+1), and the number of input/output data lines corresponding thereto is also (k+1). Accordingly, the number of different types of charge amounts to be output to the bit line BL, and the number of potential values corresponding to the charge amounts are in both cases $2^{(k+1)}$.

FIG. 5 shows a potential shift diagram indicating time-changes in the bit line potential VBL. A point tR is a time when the read signal READ becomes to be H level. The charges Q have a relation in their magnitude of QA>QB>QC>QD. Therefore, the bit line potentials VBL have a relation of VBLA>VBLB>VBLC>VBLD. When three reference levels VREFA, VREFB and VREFC of the sense amplifier circuit 3 are set to have a relation of VBLA>VREFA>VBLB>VREFB>VBLC>VREFC>VBLD, in the case of the data A, the potential VSAA is at H level, the potential VSAB is at H level, and the potential VSAC is at H level. Accordingly, data in which the data 1 is at H level and the data 2 is at H level is read out. In the case of the data B, the potential VSAA is at L level, the potential VSAB is at H level, and the potential VSAC is at H level. Accordingly, data in which the data 1 is at L level and the data 2 is at H level is read out. Similarly, in the case of the data C and the data D, data are also read out according to FIG. 4.

Next, when the read signal READ is set to L level, and then the restore/write signal RES/W is set to H level, since the data 1 is H data and the data 2 is H data when the data A is being read out, the bit line potential VBL is set to the power supply potential VDD, and the plate line potential VPL is set to the GND potential. As a result, an electric field directing from the bit line toward the plate line is applied to the capacitor 6, and a charge (data) associated with a polarization corresponding to the strength and the direction of the electric field is restored in the ferroelectric capacitor 6. Then, the power supply potential VDD on the word line WL1 is set to the GND potential, to thereby put the transistor 5 in an OFF state, and to put the restore/write signal RES/W to L level, whereby the reading operation is completed. Similarly, in the case of the data B, C and D, potentials shown in FIG. 4 are applied to the bit line and plate line in a manner described above, to thereby complete the reading operation. A restoring operation is the same as a writing operation to the extent that data that is read out is written.

Figure 8:
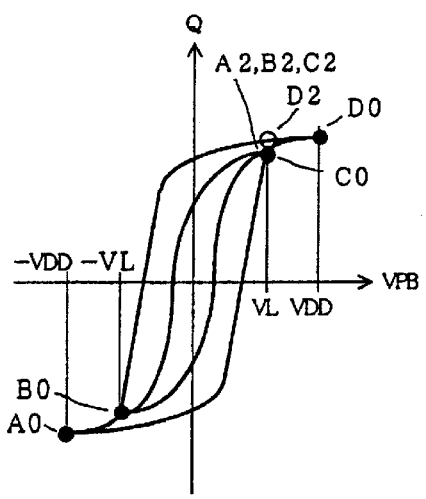
FIG. 8 shows a diagram of hysteresis curves in accordance with one embodiment of the present invention.
Figure 12:
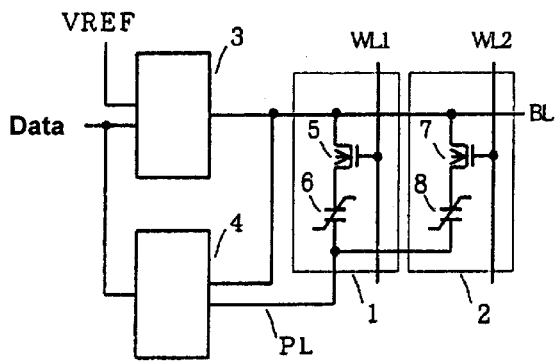
FIG. 12 shows a conventional semiconductor integrated circuit.

FIG. 8 is a graph showing hysteresis curves relating to the case when restoring in the ferroelectric capacitor. When data that is read is the data A, a point A2 shifts to a point A0; in the case of the data B, a point B2 shifts to a point B0: in the case of the data C, a point C2 shifts to a point C0 (at the same point); and in the case of the data D, a point D2 shifts to a point D0.

In the present embodiment, an operation with two bits for one memory cell using the power supply potential VDD and the potential VL is described. However, as described above, when (k+1) types of different potentials can be used, an operation with (k+1) bits for one memory cell can be conducted in a similar manner as the present embodiment. Based on this principle, concrete methods of setting different potentials such as the above-described potential VL in addition to the power supply potential VDD may include for example the following two methods.

In the first method, as described above, a potential VL that is lowered by a threshold potential of the Nch transistors 9, 10 and 11 of the restore/write circuit 4 in FIG. 1 is set. Furthermore, each of the Nch transistors 9, 10 and 11 is replaced with a circuit having a plurality of Nch transistors serially connected to one another. Accordingly, threshold voltages in the number of the Nch transistors are provided, and a plurality of potentials that are lowered from the power supply potential VDD by the respective threshold voltages can be set. The number of bits that can be stored increases by the number of the plurality of the set potentials, by the same principle of the above-described embodiment example.

In the second method, in lowering the power supply potential VDD by a plurality of predetermined voltages, one resistance or a plurality of serially connected resistances can be inserted in a path from the power supply potential VDD to the bit line BL and the plate line PL in the restore/write circuit 4, to thereby optionally set application voltages to be added.

Also, the first method and the second method may be combined, such that one or a plurality of resistance elements may be serially connected to each of the Nch transistors 9, 10 and 11 in a path from the power supply potential VDD to the bit line BL and the plate line PL in the restore/write circuit 4.

Figure 9:
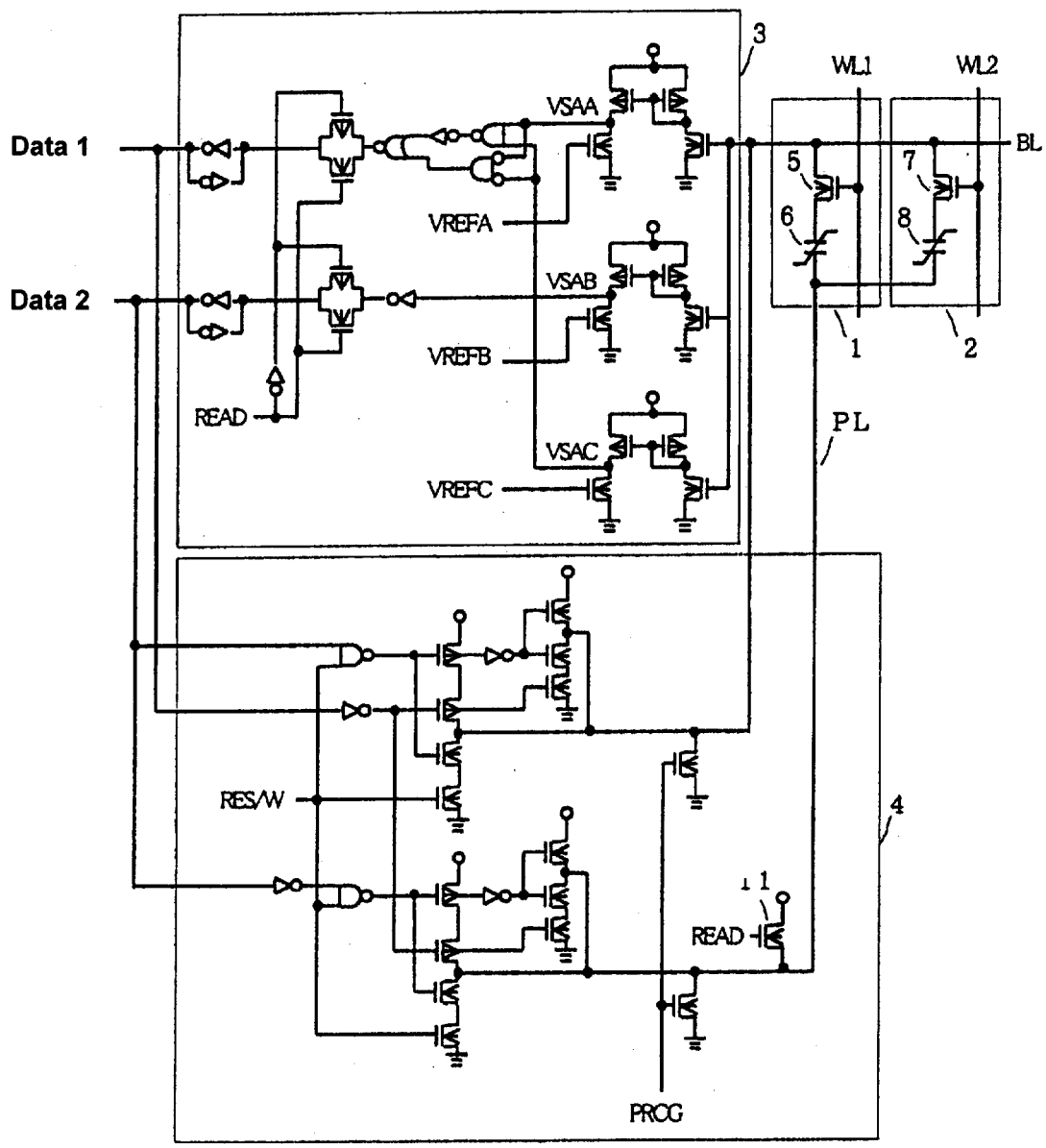
FIG. 9 shows a circuit diagram of a semiconductor integrated circuit in accordance with a modified embodiment of the present invention.

In other words, in lowering the power supply potential VDD by a plurality of predetermined voltages to add and set application voltages, appropriate electronic elements and circuit elements that have voltage-lowering effects such as transistors and resistor elements may be used. In this manner, appropriate modifications and design changes that provide similar effects can be made within a range that does not depart from the subject matter of the present invention. For example, a modified example of the semiconductor integrated circuit of FIG. 1 is shown in FIG. 9. In FIG. 9, Nch transistors 9, 10 and 11 and their peripheral circuits in a circuit diagram of FIG. 1 are realized by a different system.

Figure 11:
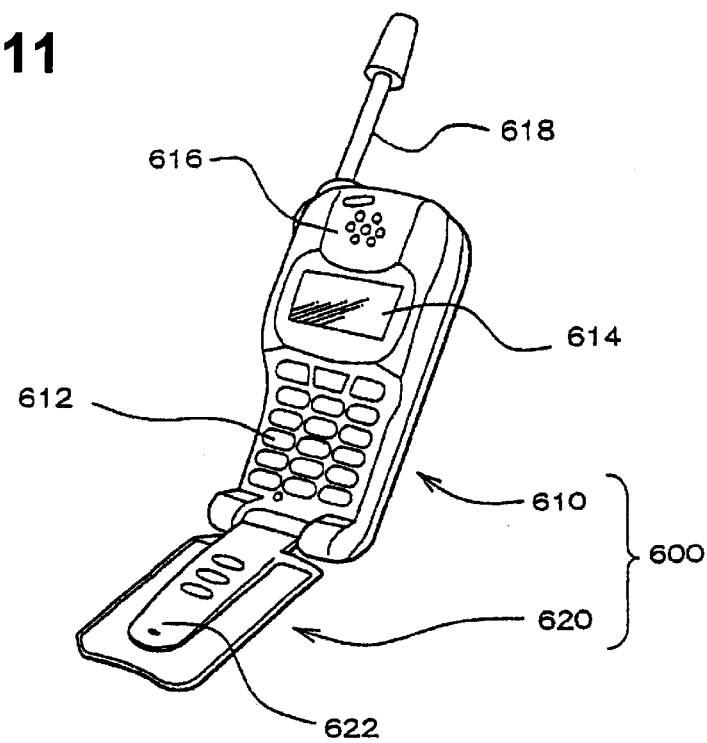
FIG. 11 shows a perspective view of a hand-carry type telephone that is equipped with the system shown in FIG. 10.
Figure 10:
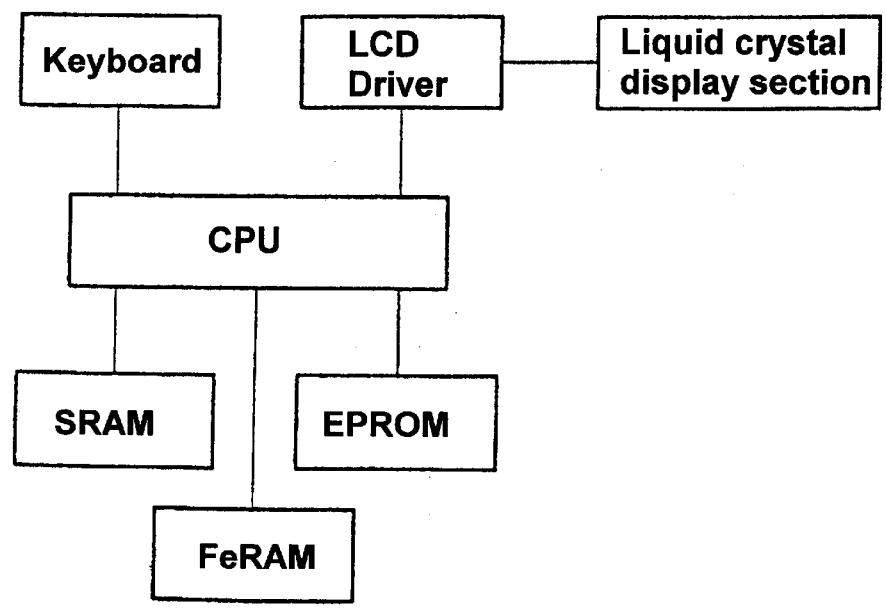
FIG. 10 shows a block diagram of a part of a hand-carry type telephone system as one example of an electronic apparatus in accordance with the present invention.

It is noted that a semiconductor device of the present invention can be applied to, for example, hand-carry type data terminals and telephones. FIG. 10 shows a part of an example of a system structure of an internal circuit thereof. As shown in FIG. 10, in addition to a FeRAM that is a semiconductor device in accordance with the present invention, an SRAM, an EEPROM, a keyboard and an LCD driver are connected through a bus line to a CPU. FIG. 11 shows a perspective view of a hand-carry type telephone that is equipped with the system. The hand-carry type telephone 600 shown in FIG. 11 is formed from a main boy portion 610 and a lid portion 620. The main body portion 610 is equipped with well-known elements that perform linked actions, such as, for example, a keyboard 612, a liquid crystal display section 614, a receiver section 616, and antenna section 618. The lid portion 620 is equipped with a well-known transmission section 622 that performs actions linked with the main body section.

By applying voltages in at least two values or greater for each of the directions of voltages applied to a ferroelectric body, data in at least two bits can be stored. Accordingly, the degree of an effective integration that is the same as or greater than that of a flash memory composed of one transistor can be attained and a greater capacity can be readily achieved.

What is claimed is:

1. A semiconductor integrated circuit characterized in comprising:

a ferroelectric capacitor;

a switching transistor having one of source/drain being connected to one electrode of the ferroelectric capacitor;

a plate line connected to the other electrode of the ferroelectric capacitor;

a bit line connected to the other source/drain of the switching transistor;

a data writing circuit connected to the plate line; and a sense amplifier circuit connected to the bit line, the semiconductor integrated circuit characterized in that a plurality of voltage values are supplied from the data writing circuit through the bit line and the plate line between the electrodes of the ferroelectric capacitor, to thereby store charges in the ferroelectric capacitor according to the voltage values to thereby store a plurality of data.

2. A semiconductor integrated circuit according to claim 1 characterized in that the data writing circuit is equipped with an application potential selection and supply device that applies as the voltage values one pair of two potentials that are optionally combined and selected among one or a plurality of set potentials, a specified power supply potential and a grounding potential to the bit line and the plate line, wherein the data in the number of the pairs of potentials to be selected are stored.

3. A semiconductor integrated circuit according to claim 2 characterized in that the application potential selection and supply device of the data writing circuit is equipped with a voltage step-down device having one or a plurality of transistors each having a predetermined threshold potential or resistor elements in a supply path of the power supply potential directed toward the bit line or the plate line, wherein the application potential selection and supply device selectively applies the set potentials that are stepped down from the power supply potential by the threshold potentials of the transistors or the set potentials that are lowered by the resistor elements to the bit line or the plate line.

4. A semiconductor device having the semiconductor integrated circuit according to claim 1, that is equipped with a plurality of memory cell groups each including many of the arranged memory cells, the bit line and the plate line, the word lines, the sense amplifier circuit and the data wiring circuit, wherein data input/output lines are connected to the sense amplifier circuit and the data wiring circuit for storing the data.

5. A semiconductor device according to claim 4 characterized in that the semiconductor device functions as a ferroelectric memory.

6. An electronic apparatus characterized in comprising a semiconductor device according to claim 5.

7. A semiconductor integrated circuit characterized in comprising:

a ferroelectric capacitor;

a first wiring electrically connected to one electrode of the ferroelectric capacitor through a switching transistor; and a second wiring electrically connected to the other electrode of the ferroelectric capacitor;

wherein, based on a potential applied to one of the electrodes of the ferroelectric capacitor through the first wiring and a potential applied to the other of the electrodes of the ferroelectric capacitor through the second wiring, data corresponding to a strength and direction of an electric field generated in the ferroelectric capacitor is stored, and wherein the potential applied to the first wiring and the second wiring is in at least three values or more.

* * * * *